United States Patent
Ling et al.

(10) Patent No.: US 11,462,936 B2
(45) Date of Patent: Oct. 4, 2022

(54) POWER SUPPLY SYSTEM WITH UPS, PCS AND CIRCUIT DIAGNOSIS CAPABILITIES

(71) Applicant: FORTUNE ELECTRIC CO., LTD., Taoyuan (TW)

(72) Inventors: Shou-Hung Welkin Ling, Taoyuan (TW); I-Sheng Hsu, Taoyuan (TW); Jui-Yang Tsai, Taoyuan (TW)

(73) Assignee: FORTUNE ELECTRIC CO., LTD., Taoyuan (TW)

( * ) Notice: Subject to any disclaimer, the term of this patent is extended or adjusted under 35 U.S.C. 154(b) by 206 days.

(21) Appl. No.: 17/101,119

(22) Filed: Nov. 23, 2020

(65) Prior Publication Data

US 2022/0115901 A1    Apr. 14, 2022

(30) Foreign Application Priority Data

Oct. 12, 2020  (TW) ................. 109135162

(51) Int. Cl.
| | |
|---|---|
| H02J 3/38 | (2006.01) |
| H02J 9/06 | (2006.01) |
| H02M 7/44 | (2006.01) |
| G01R 31/36 | (2020.01) |
| G01R 21/06 | (2006.01) |
| G01R 31/387 | (2019.01) |
| H02J 7/00 | (2006.01) |

(52) U.S. Cl.
CPC .............. *H02J 9/062* (2013.01); *G01R 21/06* (2013.01); *G01R 31/3647* (2019.01); *G01R 31/387* (2019.01); *H02J 7/0049* (2020.01); *H02M 7/44* (2013.01)

(58) Field of Classification Search
CPC ...... H02J 9/062; H02J 7/0049; G01R 31/387; G01R 31/3647; G01R 21/06; H02M 7/44
USPC .......................................................... 307/23
See application file for complete search history.

(56) References Cited

U.S. PATENT DOCUMENTS

2014/0368042 A1* 12/2014 Giuntini ................ H02J 3/1864
                                                                       307/64

* cited by examiner

*Primary Examiner* — Toan T Vu
*Assistant Examiner* — Dru M Parries
(74) *Attorney, Agent, or Firm* — Lin & Associates Intellectual Property, Inc.

(57) ABSTRACT

A power supply system with UPS, PCS and circuit diagnosis capabilities is disclosed, including: a DC-bus connected to a voltage/current (V/I) meter, a battery energy storage system (ESS) container, a power conditioning system (PCS), at least one current translation unit, and an energy management controller (EMC), wherein, the V/I meter is used to monitor the voltage and current of the DC-bus, and the PCS performs bi-directional conversion between the DC current from the DC-bus and the AC power from an external distribution panel, the current translation unit translate the DC current from the DC-bus into a voltage suitable for at least a critical load, and the EMC controls the operation of the V/I meter, the battery ESS container, the PCS, and the at least one current translation unit, respectively.

12 Claims, 5 Drawing Sheets

POWER SUPPLY SYSTEM WITH UPS, PCS AND CIRCUIT DIAGNOSIS CAPABILITIES

BACKGROUND OF THE INVENTION

1. Field of the Invention

The present invention relates generally to a power supply system with UPS, PCS and circuit diagnosis capabilities.

2. The Prior Arts

For many industrial, commercial applications or life-critical medical institutions that must operate continuously without interruption, the importance of uninterruptible power systems (UPS) is self-evident. The UPS is a device that continuously provides backup AC power for electrical equipment and loads to maintain the normal operation under the condition of abnormal power grid. Common power grid abnormalities include conditions such as power outages, insufficient voltage, interference, or surge currents. UPS is usually used to maintain the uninterrupted operation of critical commercial equipment or precision instruments such as computers, switches, or servers, to prevent computer data loss, interruption of telephone communication networks, or loss of control of instruments. If the power supply to the computer is abnormally interrupted or the current is unstable, the UPS will assume the role of temporary power supply, so that the computer will not lose data due to a power failure or cause system damage. A common scenario is that the UPS itself can support a butter time of tens of minutes of power supply, so that users can complete the tasks at hand, such as, archiving files, and then shut down according to the normal procedure, so that the data can be preserved.

The principle of supplying power of UPS is that when the mains electricity, i.e., the power grid, is normal, the machine converts the alternating current (AC) of the mains electricity into direct current (DC) and charges the battery. When the UPS detects that the mains voltage is abnormal or outage, the UPS converts the DC power stored in the battery to AC power and supplies the AC power to the loads for continued use to achieve the function of uninterrupted power. The UPS comprises mainly batteries, monitoring software, relays and other equipment, but due to the limited battery capacity, the UPS is not suitable for loads that consume large amounts of power. FIG. 1 shows a schematic view of the basic structure of a conventional UPS; as shown in FIG. 1, the UPS 100 is located between a mains electricity 110 and a critical load 120, and includes a rectifier circuit 101 and a charging circuit 102. After the mains electricity 110 passes through a filter circuit and a surge absorption circuit 130, the electricity simultaneously passes through the rectifier circuit 101 and the charging circuit 102 of the UPS 100 respectively, and then provides power to the critical load 120; wherein the charging circuit 102 further includes an AC/DC converter 102A serially connected to a DC/AC inverter 102B, and an energy storage battery 140 is connected to the joint.

The generally known UPS can be categorized as online type or offline type. The online UPS, when the mains electricity is normal, the electricity flows through the aforementioned two circuits at the same time, wherein one of which is through the battery pack to charge through the charging circuit, and the other is through the rectifier circuit, as the input of the converter and then converted by the inverter to provide power to the load. In other words, the output of the online UPS is supplied by the inverter, so there is no need for switching time when the mains electricity is disconnected, thus termed "online". The online UPS provides the following benefits: the ability to attenuate the noise and surge of the mains electricity is good, and the output circuit is the most stable. The power is only output by the rectifier circuit 101 when the UPS fails or is overhauled. The disadvantage of online UPS is that the power conversion components need to operate continuously for a long time, require high durability, thus high-cost components, and the accumulated power conversion loss is also high. On the other hand, for the offline UPS, when the mains electricity is normal, the mains electricity directly supplies the power required by the load, and at the same time, there is a circuit to charge the battery pack through the charging circuit. When the mains voltage is unstable, the stored power in the battery pack will pass through the converter to be converted to alternating current. As seen, the offline UPS has two sets of power alternately used. Since the two sets of power require switching time when alternately switched, the ability to protect the load from the noise and surge attenuation of the mains electricity is poor. However, the offline UPS is simple in structure, small in size and light in weight, so the cost is low. There is also a line-interactive UPS that is somewhat between the online and offline UPSs, and operates with the principle similar to the offline UPS.

Moreover, Power Conditioning System (PCS) is an extremely important topic in recent years in the field of Energy Storage System (ESS) technology and power grid construction. With the rise of the global green energy industry, the construction of ESS and power grids has also become one of the industry's prominent studies. The construction of the power grid needs to rely on the integration of various technologies such as energy storage, energy conversion, and power consumption monitoring. Because such technologies are sufficient to determine the future of the green energy industry, these technologies are the focus of the current scientific and technological attention worldwide, wherein the PCS is one of key components of the core.

FIG. 2 shows a schematic view of the basic structure of a conventional PCS. As shown in FIG. 2, the PCS 200 is between a distribution panel 210 and an energy storage battery 220, the distribution panel 210 is connected between the mains electricity 230 and load 240, the PCS 200 includes a bi-directional DC/AC inverter 201. T the PCS 200 uses the mains electricity 230 through the distribution panel 210 for power to charge the energy storage battery 220, and at the same time, the power of the energy storage battery 220 is provided to the load 240 through the distribution panel 210 when the power needs to be adjusted.

The PCS has a wide range of applications, the main application modes include load-shift, peak-shaving, and demand response. A common example of load-shift is to store the surplus electricity during the day and transfer it to night or other time for use. For the intermittent operation with high-variable electricity consumption mode, the discharge of the ESS is used to replace the occasional peak electricity consumption. Peak-shaving reduces the electricity capacity in order to achieve saving expenses. The demand response aims at the smooth electricity consumption mode, and obtains service income through services such as off-peak charging, peak discharge and participation in electricity sales, to improve economic efficiency. More importantly, when the power regulation system is integrated into the power grid that generally contains renewable energy, it can also provide management power quality, increase renewable energy penetration, power supply stability and reliability, and alleviate transmission and distribution congestion. Moreover, in the demand side from the users, the PCS can also be used as an uninterrupted power supply to provide stable power supply, and can also be equipped with renewable energy power generation equipment to provide load tracking and ramping support to reduce electricity consumption.

Compared with traditional units that consume fossil fuels and cause carbon emissions and pollution problems, renewable energy does not produce carbon emissions, can be recycled and has high autonomy, but the disadvantage is that renewable energy power supply has innate restrictions, such as, time, intermittent and volatility, and so on. However, due to the substantial increase in electricity demand for the development of many industries, industrial users consuming large amount of power, including petrochemicals, plastics, steel, semiconductors, printed circuit boards, and electronic information, often have to install related renewable energy power generation equipment or energy storage equipment in order to take into account the economy benefit and sustainable development.

However, as ESS gradually moves towards the economic concerns instead of strictly technological issue, grid-level ESS must effectively integrate energy storage batteries and application technologies to solve all problems related to the stability of high-quality power supply. In particular, the power regulation system is a key system connecting battery packs and grid applications, and also serves as the execution of energy storage power regulation. It is necessary to implement effective and safe storage and discharge management under the deployment of monitoring and dispatching systems. Therefore, how to effectively integrate the PCS into the ESS, while integrating into the existing power supply system in a compatible and seamless manner, is an important issue facing the industry.

SUMMARY OF THE INVENTION

A primary objective of the present invention is to provide a power supply system with UPS, PCS and circuit diagnosis capabilities, capable of providing uninterrupted power functions for critical loads, and achieving power regulation functions such as balanced-load power supply.

Another objective of the present invention is to provide a power supply system that is compatible with existing critical loads equipped with UPS systems, and at the same time able to reduce the setup cost of UPS functions required for newly added critical loads.

For achieving the foregoing objectives, the present invention provides a power supply system with UPS, PCS and circuit diagnosis capabilities, comprising: a voltage and current meter (V/I meter), a direct current bus (DC bus), a battery energy storage system container (battery ESS container), a power conditioning system (PCS), at least one current conversion unit, and an energy management controller (EMC); wherein, the V/I meter, the battery ESS container, the PCS, and the at least one current conversion unit are respectively connected to the DC bus. The V/I meter is used to monitor the voltage and current of the DC bus. The PCS can convert the DC current of the DC bus and the AC power of an external distribution panel in both directions, and then the distribution panel provides the power to at least one external load. The current conversion unit converts the DC current from the DC bus and provides to a load, the energy management controller is respectively connected to the V/I meter, the battery ESS container, the PCS, and the at least one current conversion unit for controlling the operation of the V/I meter, the battery ESS container, the PCS, and the at least one current conversion unit.

In a preferred embodiment, the external distribution panel is further connected to a power grid for power distribution, so as to provide an AC current to each external non-critical load.

In a preferred embodiment, the current conversion unit comprises a DC/DC converter connected in series with an uninterruptible power system to provide current to an external critical load.

In a preferred embodiment, the current conversion unit comprises a DC/DC converter for providing current to an external critical load having an uninterrupted power system.

In a preferred embodiment, the current conversion unit comprises a DC/AC inverter connected in series with a switch to provide current to an external critical load.

In a preferred embodiment, the switch is connected to the external distribution panel so as to switch power supply source of the external critical load between the D/AC inverter and the external distribution panel.

In a preferred embodiment, the current conversion unit is a DC/DC converter for providing current to an external electric vehicle.

In a preferred embodiment, the energy management controller executes the following steps in sequence:

S110: Read sensing data;

S120A: receiving a system stop command? If yes, go to step S126; otherwise, go to step 120B;

S120B: Is the power grid off? If yes, go to step S121; otherwise, go to step 120C;

S120C: Is the current of the DC bus conserved? If yes, go to step S130; otherwise, go to step 126;

S121: Estimate the execution time of all critical loads provided by the battery ESS;

S122: Is the estimated execution time in step S121 higher than the desired uninterrupted power running time? If yes, go to step S124; otherwise, go to step 123;

S123: Terminate a critical load with lowest priority, return to step S122;

S124: The battery ESS container continues to supply power;

S125: Whether the state-of-charge (SOC) of the battery ESS is greater than zero; if yes, perform step S120B; otherwise, exit.

S126: Terminate the operation of the PCS and the battery ESS container, and then exit.

S130: Control the PCS according to a preset energy management algorithm, return to step S110.

In a preferred embodiment, the priorities of the critical loads are based on a preset priority table.

In a preferred embodiment, the priorities of the critical loads are dynamically determined.

In a preferred embodiment, the preset energy management algorithm is based on a composite cost function to perform control adjustments, and make control decisions according to lowest cost and highest profit.

In a preferred embodiment, the composite cost function includes at least a load-leveling cost function, a peak-shaving cost function, and a power quality cost function.

In a preferred embodiment, the ratio of battery capacity of the battery ESS container allocated to serving UPS and PCS functions can be dynamically adjusted.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
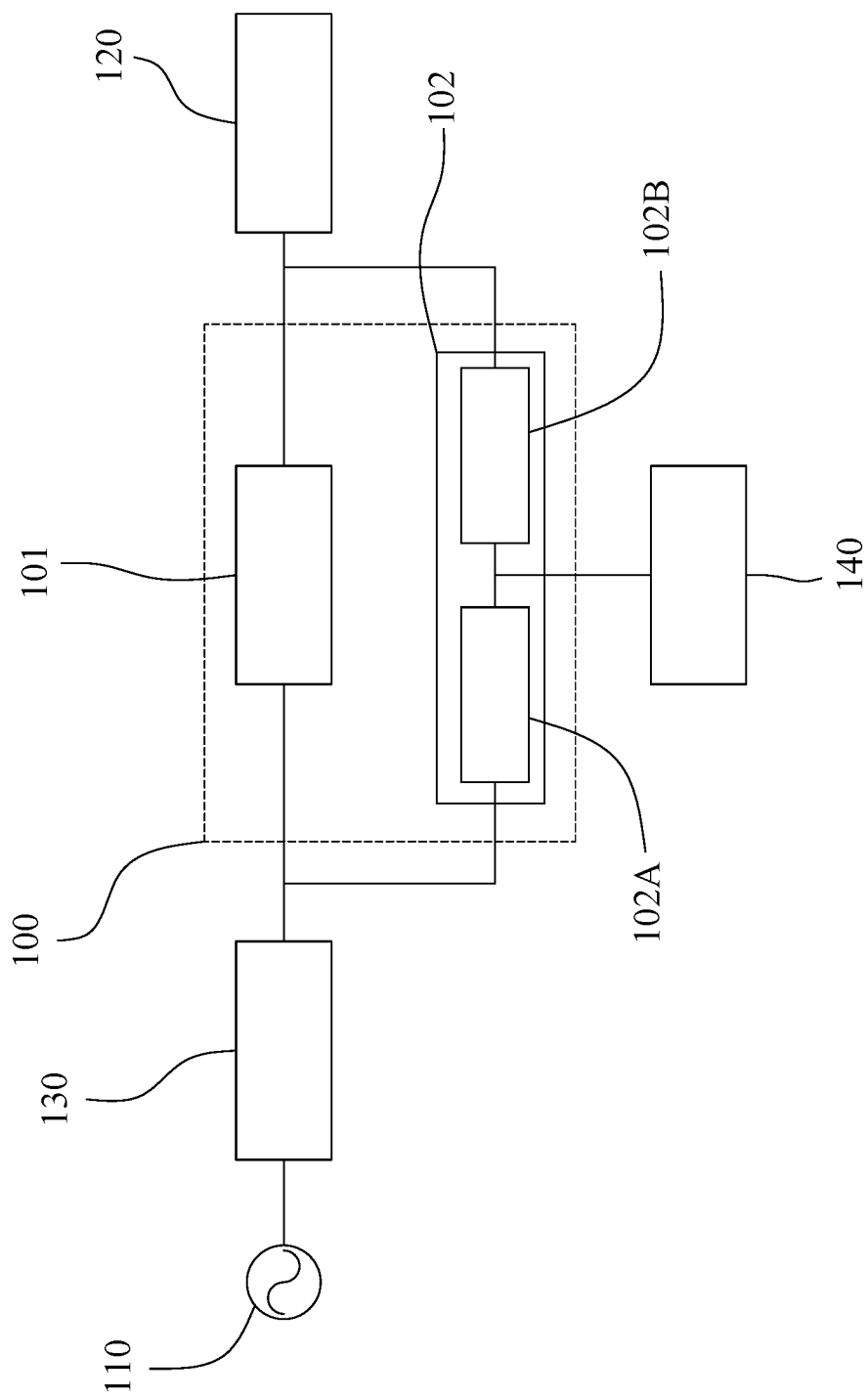
FIG. 1 shows a schematic view of the basic structure of a conventional UPS.
Figure 2:
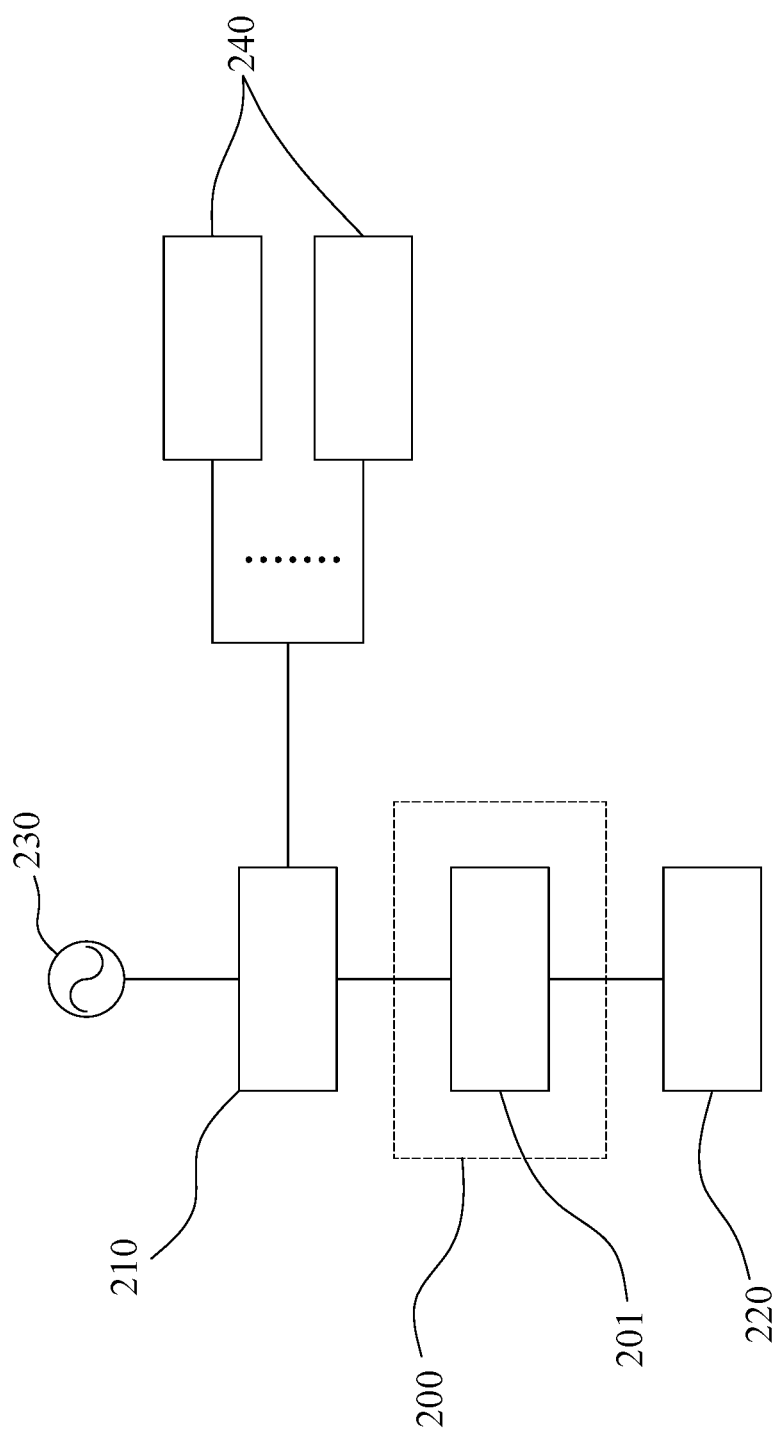
FIG. 2 shows a schematic view of the basic structure of a conventional PCS.
Figure 3:
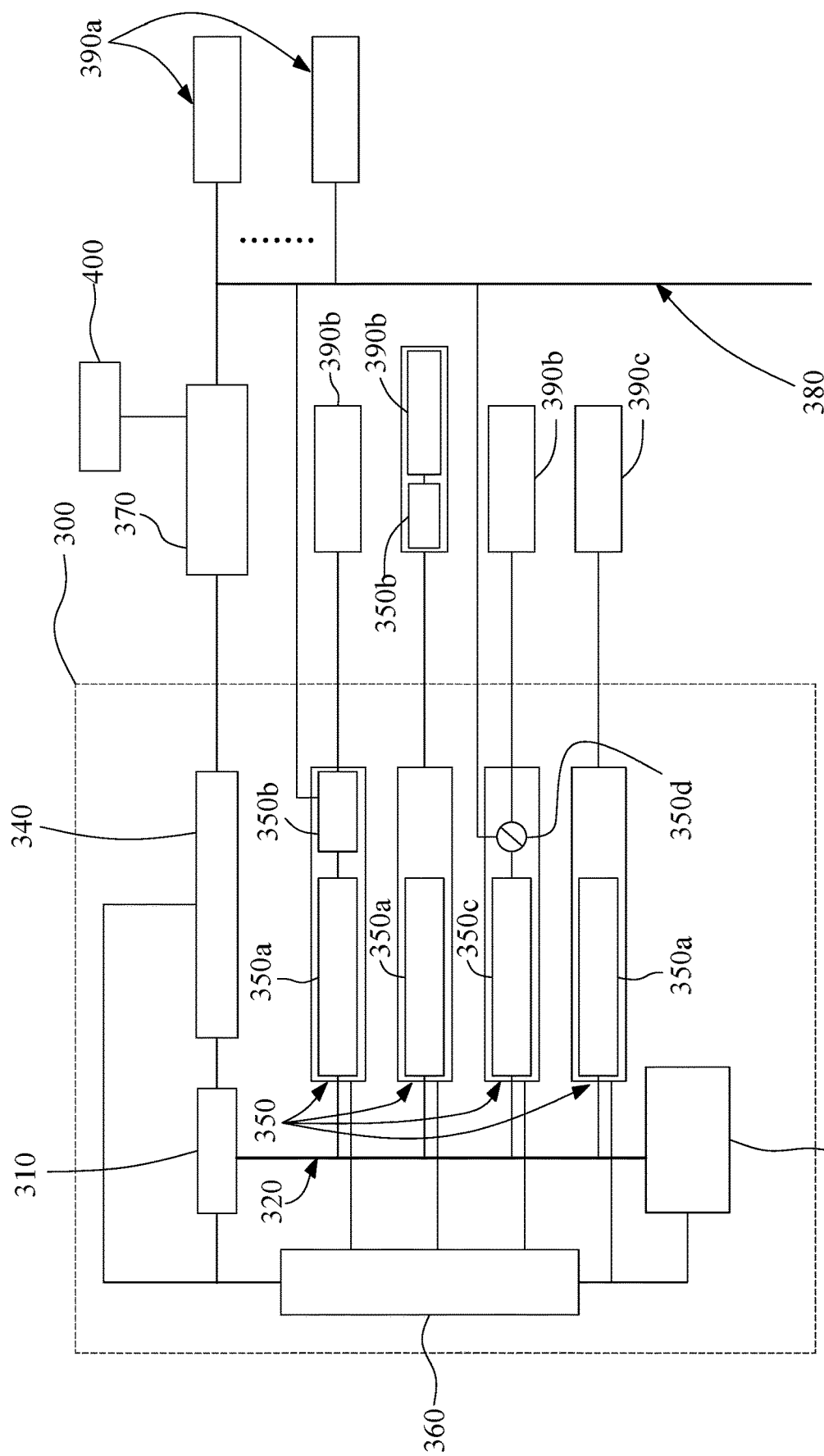
FIG. 3 shows the power supply system with UPS, PCS and circuit diagnosis capabilities of the present invention.

Referring to FIG. 3, FIG. 3 shows the power supply system with UPS, PCS and circuit diagnosis capabilities of the present invention. As shown in FIG. 3, the power supply system 300 with UPS, PCS and circuit diagnosis capabilities, comprises: a voltage and current meter (V/I meter) 310, a direct current bus (DC bus) 320, a battery energy storage system container (battery ESS container) 330, a power conditioning system (PCS) 340, at least one current conversion unit 350, and an energy management controller (EMC) 360.

Wherein, the battery ESS container 330 is responsible for providing DC power as the power source of the present invention, the DC power bus 320 is a bus that provides DC power from the battery ESS container 330, and the V/I meter 310 serves to monitor and measure the magnitude of the voltage and current on the DC bus 320; the PCS 340 and the at least one current conversion unit 350 provides the DC power from the battery ESS container 330 through the DC bus 320 directly or indirectly to various external loads. Therefore, the V/I meter 310, the battery ESS container 330, the PCS 340, and the at least one current conversion unit 350 are all connected to the DC bus 320, respectively.

The energy management controller 360 is respectively connected to the V/I meter 310, the battery ESS container 330, the PCS 340, and the at least one current conversion unit 350, for controlling the operations of the V/I meter 310, the battery ESS container 330, the PCS 340, and the at least one current conversion unit 350.

It is worth noting that the PCS 340 can bidirectionally convert the DC current of the DC bus 320 and the AC power of an external distribution panel 370, and the distribution panel 370 provides power to at least one external non-critical load 390a; on the other hand, the current conversion unit 350 converts the DC current from the DC bus 320 and provides to a critical load 390b.

In a preferred embodiment of the present invention, the external distribution panel 370 can further be connected to a power grid 400, and the power from the power grid and the battery ESS container 330 are allocated and switched by the distribution panel 370, and then output by an AC power bus 380 to provide an AC power to each external non-critical load 390a.

It is worth noting that the current conversion unit 350 of the present invention can be implemented in different embodiments. For example, in a preferred embodiment, the current conversion unit 350 can comprise a DC/DC converter 350a connected in series with an UPS 350b to provide current to an external critical load 390b, and the UPS 350b is further connected to the AC bus 380. Alternatively, in another preferred embodiment, the current conversion unit 350 may be a DC/DC converter 350a for providing current to an external critical load 390b having an UPS 350b. In an actual application scenario, the former may be a critical load 390b without an UPS 350b, and the latter may be a critical load 390b already equipped with an UPS 350b. Therefore, the present invention can integrate the critical load 390b that requires the uninterruptible power system 350b in the existing or legacy application system into the power supply system of the present invention.

Furthermore, in other preferred embodiments, the current conversion unit 350 may be a DC/AC inverter 350c connected in series with a switch 350d to provide current to an external critical load 390b. The switch 350d is connected to the external distribution panel 370 through the AC power bus 380 to switch the power supply source to the external critical load 390b between the DC/AC inverter 350c and the external distribution panel 370. In an actual application scenario, if the system needs to provide power to a newly added critical load 390b, there is no need to add an UPS when adopting the present architecture, so as to reduce the implementation cost.

Furthermore, if the external critical load 390b is an electric vehicle 390c, the current conversion unit 350 can be a DC/DC converter 350a.

It is worth noting that the power supply system 300 with UPS, PCS and circuit diagnosis capabilities of the present invention, in addition to providing UPS and PCS through the aforementioned system architecture, the coordination between the circuit diagnosis function and the overall operation of the system is based on the process that the energy management controller 360 executes.

Figure 4:
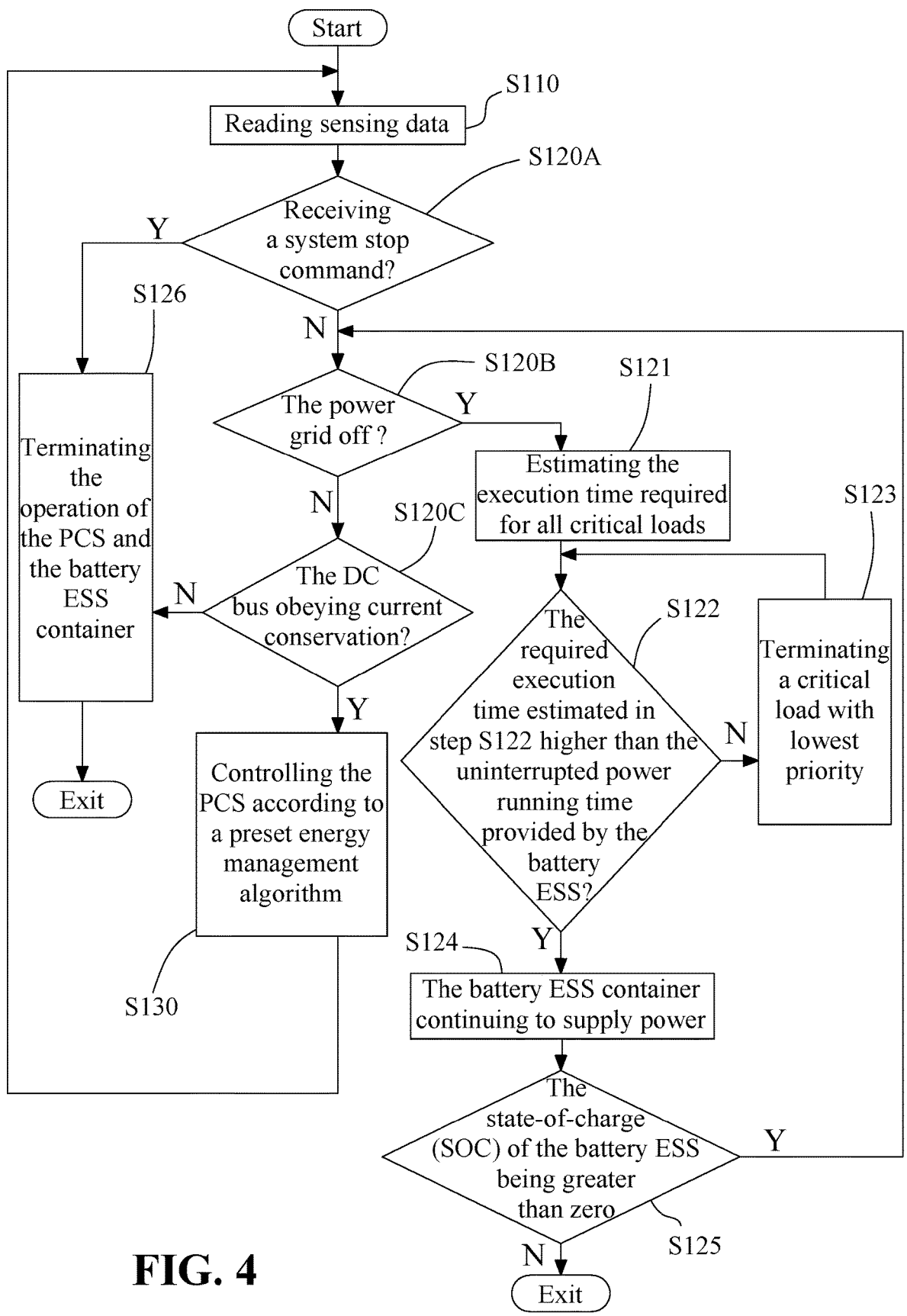
FIG. 4 shows the execution flowchart of the energy management controller in the power supply system with UPS, PCS and circuit diagnosis capabilities of the present invention.

FIG. 4 shows an execution flowchart of the energy management controller (EMC), wherein the energy management controller 360 performs the following steps:

First, in S110, the EMC reads sensing data from each component described above in the system; namely, the V/I meter 310, the battery ESS container 330, the PCS 340, and the at least one current conversion unit 350. Then, in the following detection steps S120A, 5120B, 5120C, respectively, check whether the system receives a stop operation command, such as, a stop button being pressed, and/or whether the power grid is disconnected, electricity outage is detected and whether the DC bus obeys the electric current conservation. Specifically, in step S120A: determining whether a system stop button is pressed; if yes, execute step S126; otherwise, execute step 120B; in step S120B: determining whether the power grid is off; if yes, go to step S121; otherwise, go to step 120C; in step S120C: determining whether the DC bus obeys the electric current conservation; if yes, go to step S130 to control the power conditioning system device according to a preset energy management algorithm; otherwise, go to step 126 to terminate the operation of the PCS and the battery ESS container, and then exit the process, i.e., terminate the operation of the power supply system.

Next, in step S121, the execution time of all critical loads 309a connected to the system is estimated; and in step S122, it is to check whether the estimated execution time in step S121 is higher than the desired uninterrupted power running time; if yes, go directly to step S124; otherwise, go to step 123 first, that is, terminate the critical load 309a with the lowest priority; then return to step S122 to check if further critical loads must be terminated. In step S124, the battery ESS container continues to supply power.

It is worth noting that the estimated execution time in step S121 can be calculated, for example, as follows: assuming the remaining energy in the battery ESS is $E_{KWh}$ and the summation of all critical load mean power is $P_{KW}$, then the estimated execution time (hours)=$E_{KWh}/P_{KW}$.

Specifically, the priority order of the critical loads in the step S123 may be based on a preset priority table, or may be dynamically determined by the system.

Then, step S125 is to detect whether the state-of-charge of the battery ESS container is greater than zero? If yes, perform step S120B to go back to check whether the power grid is powered off; otherwise, it indicates that the battery ESS container capacity has been exhausted, the system ceases operation.

The energy management algorithm (EMC algorithm) preset in the above step S130 is based on a composite cost function to perform control adjustments, and make control decisions according to lowest cost and highest profit.

In a preferred embodiment, the composite cost function includes at least a load-leveling cost function, a peak-shaving cost function, and a power quality cost function. Each cost function is explained as follows:

1. Load leveling: In order to make full use of time-variant electricity pricing policy or regulation, the EMC algorithm can control and adjust to absorb more electricity when the electricity price is low (for example, the night-time electricity price NTD1.46 in Taiwan for the time being); and release more electricity when the electricity price is higher (for example, daytime electricity price NTD3.42 in Taiwan for the time being).

2. Peak Shaving: By reducing peak power consumption, users can reduce contract capacity (for example, NTD236/KW in Taiwan for the time being), and avoid additional penalties for exceeding contract capacity.

3. Power Quality: When the power quality is poor (for example, voltage sag/surge or frequency deviation), it may trigger the protection circuit of the load equipment and cause operating loss. Therefore, when the power quality is poor, the EMC algorithm can separate the critical loads from the city grid power to reduce or avoid operating losses.

It is worth noting that the above cost function is only an exemplary embodiment, and other operational considerations, such as the integration of green power, can be integrated into the above EMC algorithm according to application requirements. Furthermore, each cost function can also be given a different weight to reflect actual application requirements, and the EMC algorithm can also dynamically adjust the cost function or associated weight. The aforementioned priority order of the critical load can also be integrated into the EMC algorithm to separately adjust the operating status of each critical load in the case of a power failure of the power grid.

Furthermore, the present invention can dynamically adjust the ratio of the battery capacity stored in the battery ESS container to serve the UPS and PCS functions, and improve the allocation flexibility of the overall stored power. For example, under normal operating conditions, 75% of the battery capacity of the battery ESS container can be allocated to the PCS function, and 25% is reserved for the UPS function; once the power grid is out of power, the 100% battery capacity of the battery ESS container can be reserved for the UPS function.

Figure 5:
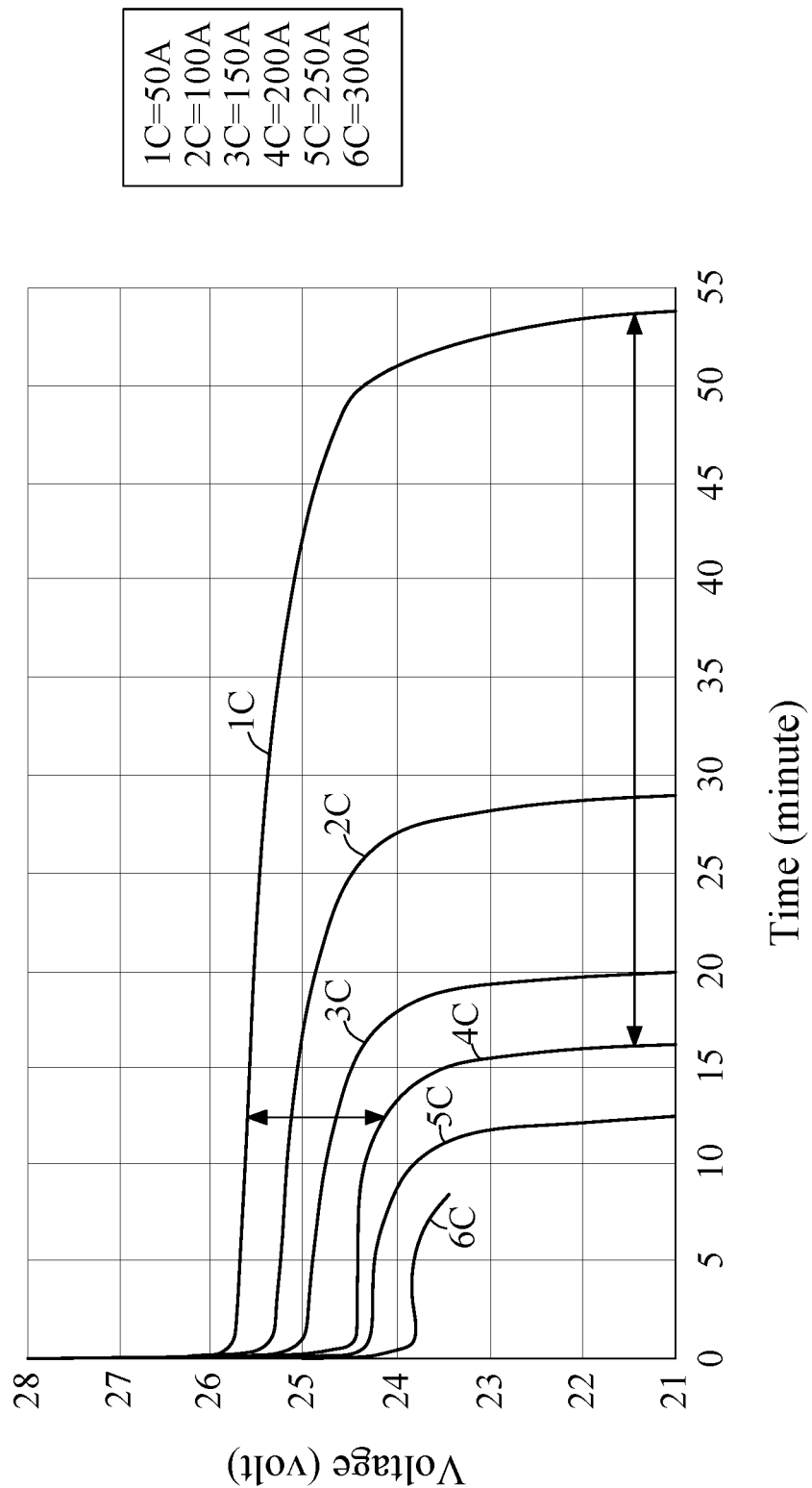
FIG. 5 shows a schematic view of the discharge rate of a conventional lithium iron-phosphorus oxide battery (LPFO 24V50Ah).

In addition to the aforementioned load leveling, peak shaving, power quality, and uninterrupted power functions for critical loads, a power supply system with UPS, PCS, and circuit diagnosis capabilities of the present invention uses the practice of using centralized architecture of the battery ESS to provide an uninterruptible power system for all critical loads also helps to align the execution time of each critical load, or alternatively, the system can also extend the uninterrupted power execution of some critical loads and shorten the uninterrupted power execution of other critical loads according to the application priority. Furthermore, by controlling the PCS power, the system can also control the power supply of the battery ESS container. Furthermore, the centralized battery ESS container can reduce the battery discharge rate (c-rate) to increase the charge and discharge efficiency and use time. For example, FIG. 5 shows a schematic view of the discharge rate (c-rate) of an existing lithium iron-phosphorus oxide battery (LPFO 24V50Ah). As shown in FIG. 5, comparing the two curves of 1C and 4C, it can be seen that when the current is reduced from 200A to 50A, the charge and discharge efficiency increases from 24.2 to 25.7, an increase of about 6%. Moreover, when the current drops from 200A to 50A, the use time increases from 16 minutes to 54 minutes, an increase of about 350%.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A power supply system with uninterrupted power system (UPS), power conditioning system (PCS) and circuit diagnosis capabilities, comprising:
    a direct current bus (DC bus);
    a power conditioning system (PCS) connected to the DC bus for converting DC current of the DC bus and AC power of an external distribution panel in both directions, the external distribution panel providing power to at least one external load;
    at least one current conversion unit connected to the DC bus for converting the DC current from the DC bus and providing the DC current to a load;
    a battery energy storage system container (battery ESS container) connected to the DC bus;
    a voltage and current meter (V/I meter) connected to the DC bus for monitoring voltage and current of the DC bus; and
    an energy management controller (EMC) connected to the V/I meter, the battery ESS container, the PCS, and the at least one current conversion unit for controlling operation of the V/I meter, the battery ESS container, the PCS, and the at least one current conversion unit;
    wherein the energy management controller is configured to execute the following steps in sequence:
        S110: reading sensing data;
        S120A: going to step S126 if a system stop command is received; otherwise, going to step 120B;
        S120B: going to step S121 if a power grid connected to the external distribution panel is off; otherwise, going to step 120C;
        S120C: going to step S130 if the DC bus obeys current conservation; otherwise, going to step 126;
        S121: estimating execution time required for all critical loads;

S122: going to step S124 if the estimated execution time in step S121 is higher than a desired uninterrupted power running time; otherwise, going to step 123;

S123: terminating a critical load with a lowest priority and returning to step S122;

S124: continuing to supply power via the battery ESS container;

S125: returning to step S120B if state-of-charge (SOC) of the battery ESS is greater than zero; otherwise, exiting;

S126: terminating the operation of the PCS and the battery ESS container and then exiting;

S130: controlling the PCS according to a preset energy management algorithm and returning to step S110.

2. The power supply system with UPS, PCS and circuit diagnosis capabilities according to claim 1, wherein the external distribution panel is connected to the power grid for power distribution to provide an AC current to each external non-critical load.

3. The power supply system with UPS, PCS and circuit diagnosis capabilities according to claim 1, wherein the at least one current conversion unit comprises a DC/DC converter connected in series with an uninterruptible power system to provide current to an external critical load.

4. The power supply system with UPS, PCS and circuit diagnosis capabilities according to claim 1, wherein the at least one current conversion unit comprises a DC/DC converter for providing current to an external critical load having an uninterrupted power system.

5. The power supply system with UPS, PCS and circuit diagnosis capabilities according to claim 1, wherein the at least one current conversion unit comprises a DC/AC inverter connected in series with a switch to provide current to an external critical load.

6. The power supply system with UPS, PCS and circuit diagnosis capabilities according to claim 5, wherein the switch is connected to the external distribution panel so as to switch power supply source of the external critical load between the D/AC inverter and the external distribution panel.

7. The power supply system with UPS, PCS and circuit diagnosis capabilities according to claim 1, wherein the at least one current conversion unit is a DC/DC converter for providing current to an external electric vehicle.

8. The power supply system with UPS, PCS and circuit diagnosis capabilities according to claim 1, wherein priorities of the critical loads are based on a preset priority table.

9. The power supply system with UPS, PCS and circuit diagnosis capabilities according to claim 1, wherein priorities of the critical loads are dynamically determined.

10. The power supply system with UPS, PCS and circuit diagnosis capabilities according to claim 1, wherein the preset energy management algorithm is based on a composite cost function to perform control adjustments, and make control decisions according to lowest cost and highest profit.

11. The power supply system with UPS, PCS and circuit diagnosis capabilities according to claim 10, wherein the composite cost function includes at least a load-leveling cost function, a peak-shaving cost function, and a power quality cost function.

12. The power supply system with UPS, PCS and circuit diagnosis capabilities according to claim 1, wherein a ratio of battery capacity of the battery ESS container allocated to serving UPS and PCS functions can be dynamically adjusted.

* * * * *